US009112449B2

(12) United States Patent
Hsiao

(10) Patent No.: US 9,112,449 B2
(45) Date of Patent: Aug. 18, 2015

(54) SELF-POWERED CRYSTAL OSCILLATOR AND METHOD OF GENERATING OSCILLATION SIGNAL

(71) Applicant: MEDIATEK INC., Hsin-Chu (TW)

(72) Inventor: Keng-Jan Hsiao, Taoyuan County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/064,190

(22) Filed: Oct. 28, 2013

(65) Prior Publication Data

US 2014/0132362 A1 May 15, 2014

Related U.S. Application Data

(60) Provisional application No. 61/726,582, filed on Nov. 15, 2012.

(51) Int. Cl.
*H03B 5/36* (2006.01)
(52) U.S. Cl.
CPC ...................................... *H03B 5/364* (2013.01)
(58) Field of Classification Search
USPC .......................................... 331/109, 158, 160
See application file for complete search history.

(56) References Cited

U.S. PATENT DOCUMENTS 5,113,156 A * 5/1992 Mahabadi et al. ............ 331/109
7,123,109 B2 * 10/2006 Stevenson et al. ............ 331/109

OTHER PUBLICATIONS

Didier Lanfranchi, Evert Dijkstra, Daniel Aebischer, A Microprocessor-Based Analog Wristwatch Chip with 3 Seconds/Year Accuracy, 1994, 92-93, IEEE.
Werner Thommen, An improved low power crystal oscillator, 1999, 146-149.
Dongmin Yoon, Dennis Sylvester, David Blaauw, A 5.58nW 32.768kHz DLL-Assisted XO for Real-Time Clocks in Wireless Sensing Applications, 2012, IEEE International Solid-State Circuits Conference, USA.
David Ruffieux, A High-Stability, Ultra-Low-Power Differential Oscillator Circuit for Demanding Radio Applications, 2002, 85-88, ESSCIRC, Switzerland.

* cited by examiner

*Primary Examiner* — Joseph Chang
(74) *Attorney, Agent, or Firm* — Winston Hsu; Scott Margo

(57) ABSTRACT

A self-powered power crystal oscillator XO includes a crystal unit and a power injection module. The crystal unit is arranged to oscillate to generate an oscillation signal. The power injection module is coupled to the crystal unit, and is arranged to intermittently inject energy to the crystal unit.

21 Claims, 7 Drawing Sheets

SELF-POWERED CRYSTAL OSCILLATOR AND METHOD OF GENERATING OSCILLATION SIGNAL

CROSS REFERENCE TO RELATED APPLICATIONS

This application claims priority of U.S. Provisional Application No. 61/726,582, filed on Nov. 15, 2012, and the entirety of which is incorporated by reference herein.

BACKGROUND

The present invention relates to a crystal oscillator, and more particularly, to a self-powered crystal oscillator and a method thereof that utilizes a power injection technique to compensate energy loss of crystal unit and consume low power.

Real-time keeping is a widely demanded function by various electronic devices, such as digital camera, GPS navigation system, mobile phone, and etc. A 32.768 kHz crystal (XTAL) with oscillation circuit is typically adopted for the generation of the real-time clock due to its high frequency stability against environmental variations. On the other hand, some of the electronic devices are portable and equipped with batteries having limited capacity. To maximize battery life, developers must minimize power consumption of components including the crystal oscillators of the electronic devices.

In the related art, the Pierce oscillation circuit is a widely-used architecture for a crystal oscillator. The Pierce oscillation circuit has sub-uW power consumption that is achievable through amplitude control technique disclosed by W. Thommen in ""*An Improved Low Power Crystal Oscillator*", Proc. of the 25th ESSCIRC, pp. 746-749, September, 1999". To reduce extra power consumption induced by the large load capacitor required by the Pierce oscillator, a differential oscillator is disclosed by D. Ruffieux in ""*A High-Stability, Ultra-Low-Power Quartz Differential Oscillator Circuit for Demanding Radio Applications*," Proc. Of the 28th ESSCIRC, pp. 85-88, September, 2002". However, both of disclosed architectures require amplifiers that are operated in the linear region and consume considerable static power, which imposed a great difficulty to reduce the power consumption of the crystal oscillator

SUMMARY

With this in mind, it is one object of the present invention to provide a crystal oscillator whose power consumption is at an ultra low level. Another object of the present invention is to provide a power injection technique that is used in a crystal oscillator, in which a crystal unit of the crystal oscillator acts as an ultra-high-Q LC tank and energy is intermittently injected into the LC tank to maintain the oscillation of the crystal unit.

In order to achieve the above objects, a crystal oscillator is provided according to one aspect of the present invention. The crystal oscillator includes: a crystal unit and a power injection module. The crystal unit is arranged to oscillate to generate an oscillation signal. The power injection module is coupled to the crystal unit, and is arranged to intermittently inject energy to the crystal unit.

In order to achieve the above objects, a method of generating an oscillation signal is provided according to another aspect of the present invention. The method includes: utilizing a crystal unit to oscillate for generating the oscillation signal; and intermittently injecting energy to the crystal unit.

As mentioned above, the present invention provides a crystal oscillator and method of generating an oscillation signal. With the power injection technique, the present invention greatly reduces the power consumption compared to the crystal oscillator.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
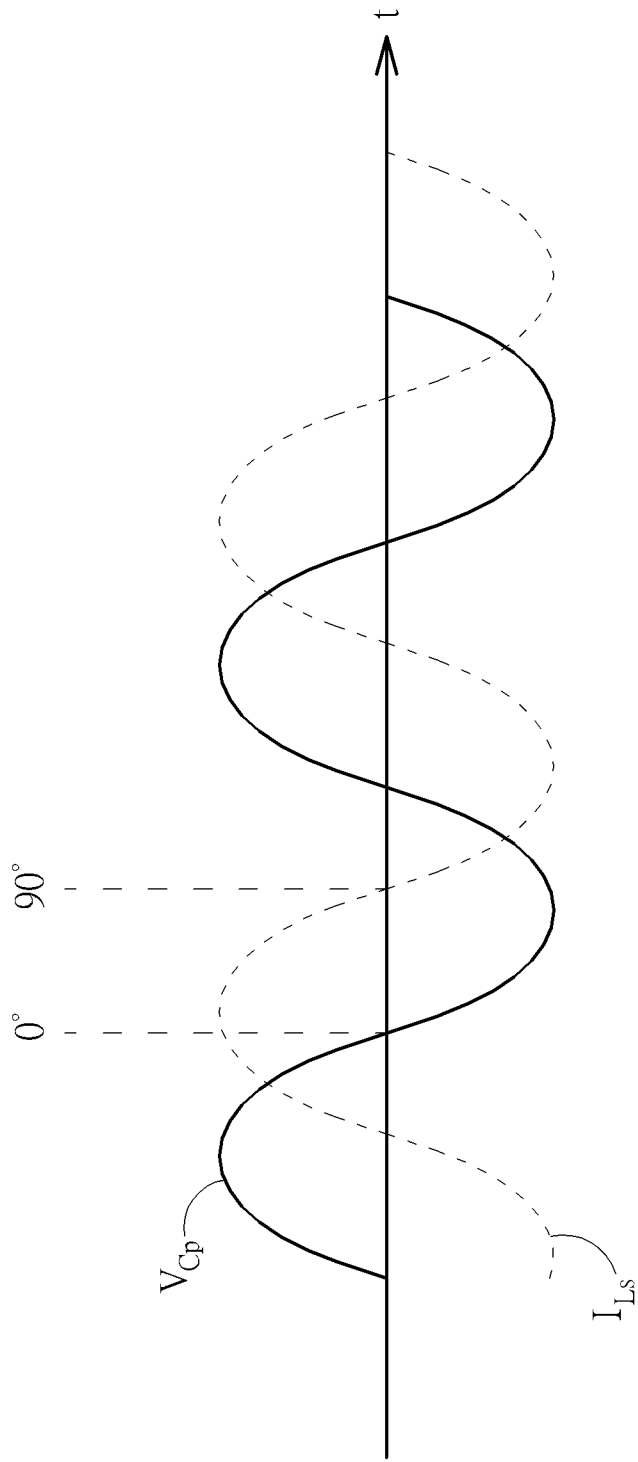
FIG. 1 depicts waveforms of signals inside a crystal unit.
Figure 2:
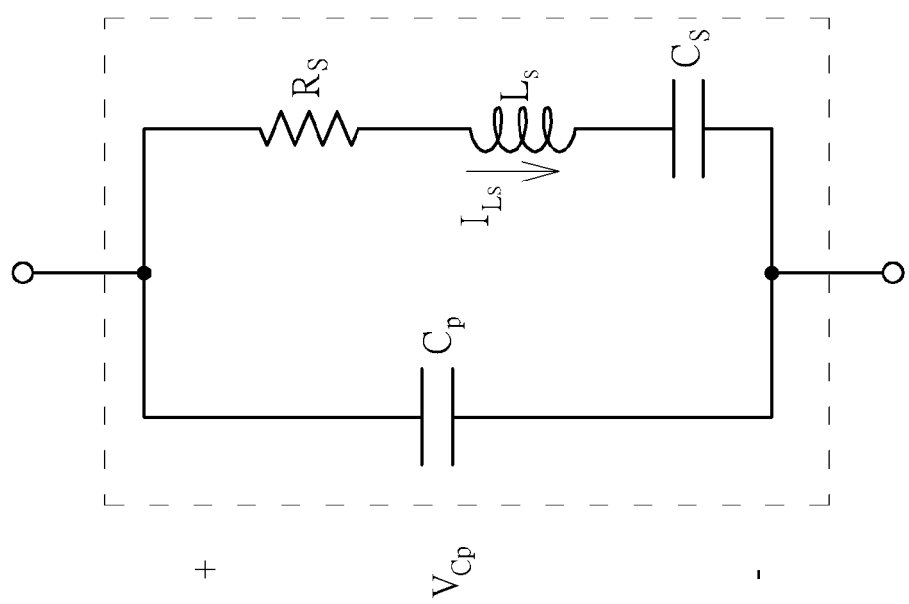
FIG. 2 depicts an equivalent circuit representing resonant modes of the crystal unit.

Please refer to FIG. 1 in conjunction with FIG. 2. FIG. 1 depicts an oscillation waveform of a crystal unit while FIG. 2 depicts an equivalent circuit represents resonant modes of the crystal unit. As $V_{C_P}$ which is a voltage across two ends of the crystal unit drops to zero, energy in the crystal unit is totally stored in an inductor $L_S$ and therefore an inductor current $I_{L_S}$ flowing through the inductor $L_S$ reaches to a maximum value. Accordingly, the voltage $V_{C_P}$ gradually builds up as the current $I_{L_S}$ flows out from the inductor $L_S$ and energy that is equivalent in amount to the energy stored in the inductor $L_S$ will be transferred and stored into the capacitor $C_P$. However, a motional resistance modeled as a resistor $R_s$, gradually dissipates the energy stored in the crystal unit while resonating. If the crystal unit could be re-energized every oscillation cycle to compensate the energy dissipated by the resistor $R_s$, the crystal unit could maintain its oscillation. Therefore, the present invention provides a power injection technique to intermittently inject the energy to the crystal unit such that the energy loss will be made up to maintain the oscillation.

Figure 3:
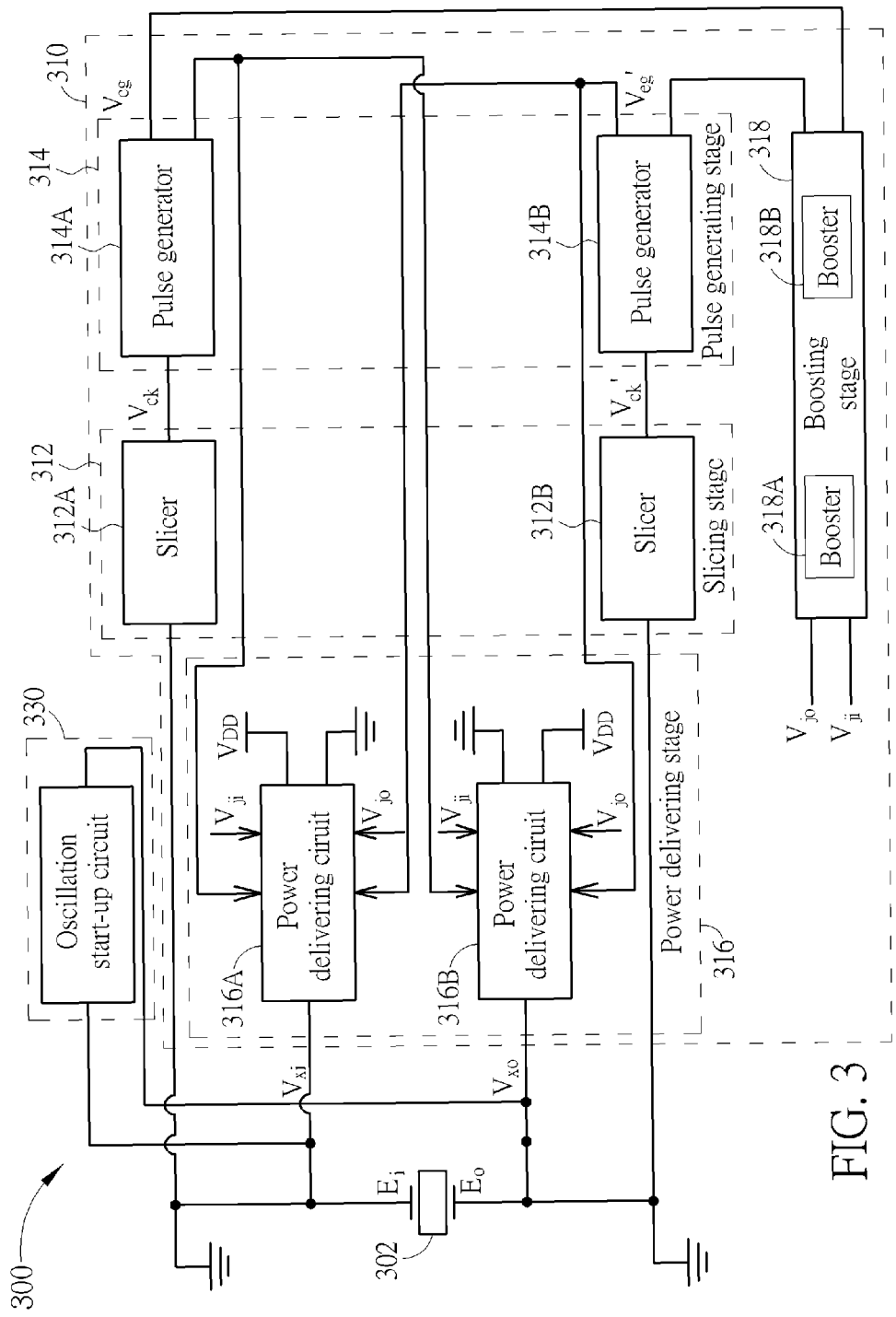
FIG. 3 depicts a diagram of a crystal oscillator according to one embodiment of the present invention.

Please refer to FIG. 3, which depicts a diagram of a crystal oscillator according to one embodiment of the present invention. A crystal oscillator 300 comprises a crystal unit 302, a power injection module 310 and an oscillation start-up circuit 330. At first, the oscillation start-up circuit 330 triggers the crystal unit 320 to start oscillating. The oscillation start-up circuit 330 may be any types of oscillation circuit used in a crystal oscillator in the related art, such as a Pierce oscillator. Once the crystal unit 302 starts oscillating or the power injection module 310 intermittently injects the energy to the crystal unit 302, the oscillation start-up circuit 330 will be turned off and will not consume any power. Afterwards, the energy loss of the crystal unit 302 will be made up by the power injection module 310.

In this embodiment, the power injection module 310 comprises: a slicing stage 312, a pulse generating stage 314 and power delivering stage 316. The power injection module 310 of this embodiment has a differential injection scheme to differentially inject the energy to the crystal unit 302 at both ends of the crystal unit 302. The differential injection scheme is intended for the benefit of direct current (DC) balance between the both ends of the crystal unit 302. In the related art, DC balance is usually achieved by a large feedback resistor connected between both ends of the crystal unit 302, which consumes considerable power, however. In order to reduce power consumption, the differential injection scheme is adopted in replacement of the large feedback resistor. For the illustrative purpose, the power injection module 310 will be explained as differentially injecting the energy into the crystal unit 302. However, this is not a limitation of the present invention. According to other embodiments of the invention, the power injection module 310 may only intermittently inject the energy to the crystal unit 302 at either ends of the crystal unit 302.

Figure 4:
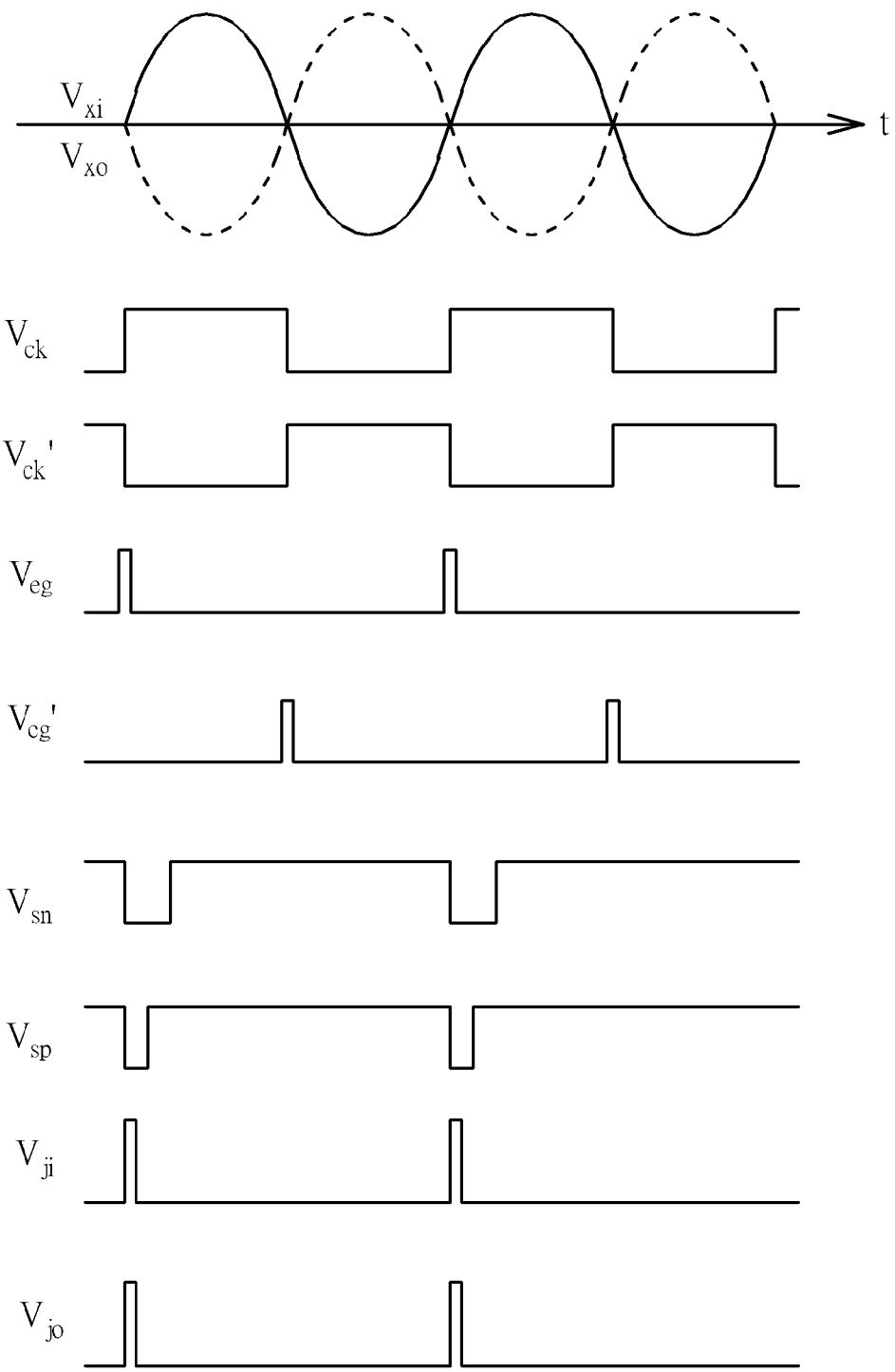
FIG. 4 depicts waveforms of signals inside the crystal oscillator of FIG. 3.

Referring back to FIG. 3, due to the differential injection scheme, each of the stages includes a pair of components, the slicing stage 312 including slicers 312A and 312B is coupled to the crystal unit 302, and is arranged to receive and slice oscillation signals $V_{xo}$ and $V_{xi}$ to generate sliced signals $V_{ck}$ and $V_{ck}'$, respectively. The pulse generating stage 314 including pulse generators 314A and 314B is coupled to the slicing stage 312, and is arranged to receive the sliced signals $V_{ck}$ and $V_{ck}'$ and accordingly extract pulse from the sliced signals $V_{ck}$ and $V_{ck}'$ to generate pulse signals $V_{eg}$ and $V_{eg}'$, respectively. The power delivering stage 316 including the power delivering circuits 316A and 316B is coupled to the pulse generating stage 312, and is arranged to intermittently deliver the energy to the crystal unit 302 according to the pulse signals $V_{eg}$ and $V_{eg}'$, respectively. Waveforms of the above signals are depicted in FIG. 4. When the oscillation signal $V_{xi}$ is in the positive half cycle, the sliced signals $V_{ck}$ rises up accordingly. When the oscillation signal $V_{xi}$ in the negative half cycle, the sliced signals $V_{ck}$ falls down. Then, rising edges of the sliced signals $V_{ck}$ will be extracted to be the pulse signal $V_{eg}$. Since the pulse signal $V_{eg}$ is extracted from the rising edges of the sliced signals $V_{ck}$, pulses of the pulse signal $V_{eg}$ occurs while the voltage $V_{xi}$ is going up. Similarly, pulses of the pulse signal $V_{eg}'$ occurs while the voltage $V_{xo}$ is going up. When the pulse occurs, the power delivering stage 316 is triggered to operate to inject the energy to the crystal unit 302. In particular, when the voltage $V_{xi}$ goes up, the power delivering stage 316 provides the end $E_i$ of the crystal unit 302 with a first supply voltage (e.g. $V_{DD}$) that is higher than the voltage level of the voltage $V_{xi}$ to charge the capacitor $C_P$ inside the crystal unit 302 to the first supply voltage such that the energy loss can be made up. Due to differential injection scheme, the power delivering stage 316 also provides a second supply voltage (e.g. ground) to the end $E_o$ of the crystal unit 302. When the voltage $V_{xo}$ goes up, the power delivering stage 316 provides the end $E_o$ of the crystal unit 302 with the first supply voltage (e.g. $V_{DD}$) that is higher than the voltage level of the voltage $V_{xo}$ to charge the capacitor $C_P$ inside the crystal unit 302 to the first supply voltage. Also, the power delivering stage 316 provides the second supply voltage (e.g. ground) to the end $E_i$. Because the energy provided by the power delivering stage 316 is injected conforming to an energy flow inside the crystal unit 302, thereby minimizing the disturbance induced by the power injection technique.

Figure 5:
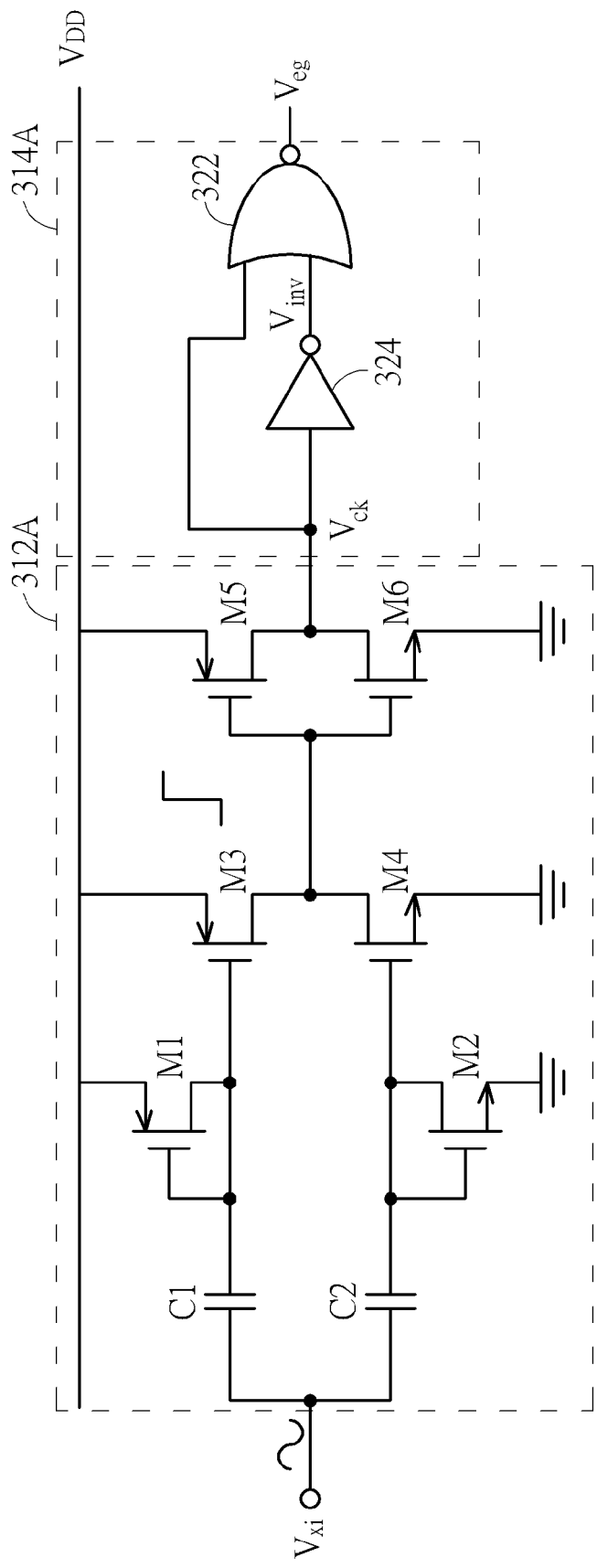
FIG. 5 depicts an implementation of the slicer and the pulse generator of FIG. 3 according to one embodiment the present invention.

FIG. 5 depicts a detailed scheme of the slicer 312A and the pulse generator 314A according to one embodiment of the present invention. The oscillation signal $V_{xi}$ generated by crystal unit 302 at the first end $E_i$ is alternating current (AC)-coupled to gates of a PMOS transistor M3 and an NMOS transistor M4 by capacitors C1 and C2, respectively. Diode-connected transistors M1 and M4 respectively bias the PMOS transistor M3 and the NMOS transistor M4 at different DC biasing points. As a consequence, both of transistors M3 and M4 are normally cut-off, and therefore no static current and power will be consumed by the PMOS transistor M3 and the NMOS transistor M4. The output of the PMOS transistor M3 and the NMOS transistor M4 will toggle between high and low levels according to the voltage level of oscillation signal $V_{xi}$, thereby generating a square wave. Then the square wave is sent to an inverter composed of a PMOS transistor M5 and a NMOS transistor M6 to generate the sliced signal $V_{ck}$. The sliced signal $V_{ck}$ is sent to the pulse generator 314A. The pulse generator 314A comprises a NOR gate 322 and an inverter 324. The inverter 324 inverts the sliced signal $V_{ck}$ and accordingly outputs an inversed signal $V_{inv}$. One input end of the NOR gate 322 is connected to the sliced signal $V_{ck}$ while the other input end of the NOR gate 322 is connected to the inversed signal $V_{inv}$. By performing a NOR operation upon these inputs, the NOR gate 322 extracts rising edges from the sliced signal $V_{ck}$ to be the pulse signal $V_{eg}$. The scheme of the slicer 312B and the pulse generator 314B is substantially identical to that is depicted in FIG. 5. The only difference is the signals that is inputted to and outputted from. For the slicer 312B and the pulse generator 314B, the oscillation signal $V_{xo}$ is inputted to the slicer 312B while the pulse generator 314B outputs the pulse signal $V_{eg}'$.

Figure 6:
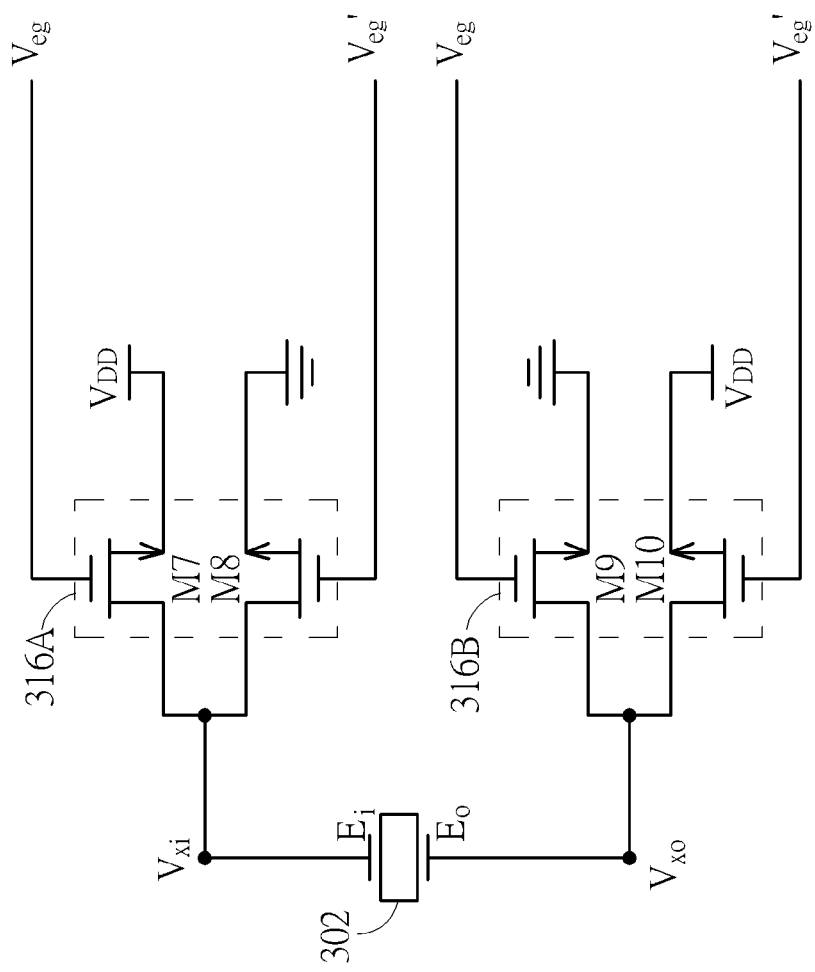
FIG. 6 depicts an implementation of the power delivering stage of FIG. 3 according to one embodiment the present invention.

FIG. 6 depicts an implementation of the power delivering stage 316 according to one embodiment the present invention. Each of the power delivering circuit 316A and power delivering circuit 316B includes two switches, preferably MOS transistors, for providing the both ends of the crystal unit 302 with either the first supply voltage ($V_{DD}$) or the second supply voltage (ground) to intermittently inject the energy to the crystal unit 302. However, in a low voltage design, the pulse signals $V_{eg}$ and $V_{eg}'$ may be not high enough to exceed threshold voltages of transistors M7-M10 to conduct the transistors M7-M10 for injecting the energy to the crystal unit 302. In this regard, a boosting stage is necessary.

Figure 7:
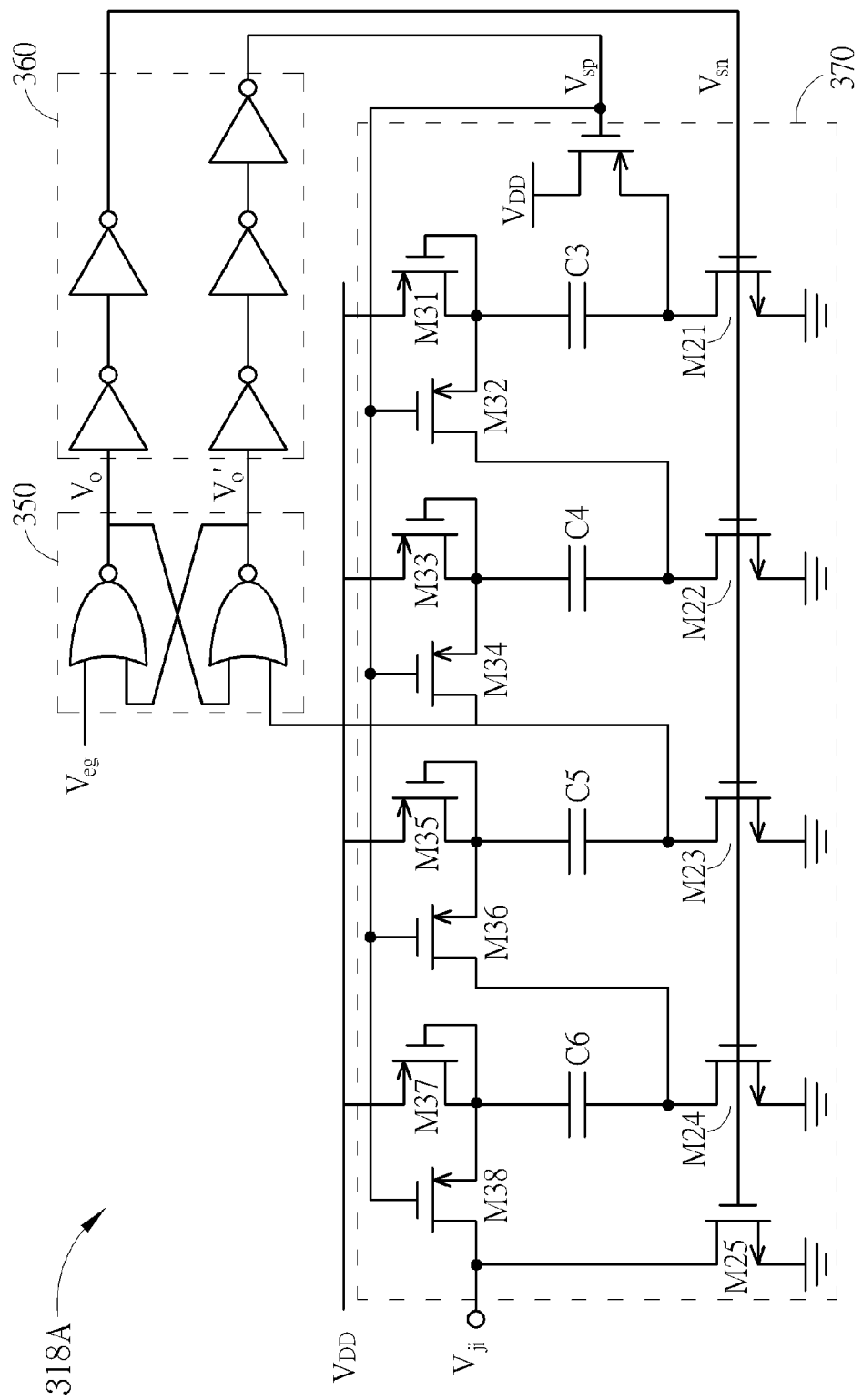
FIG. 7 depicts an implementation of a booster of a boosting stage in the power delivering stage of FIG. 3 according to one embodiment the present invention.

According to one embodiment, the power injection module 310 further includes a boosting stage 318 that is coupled between the pulse generating stage 314 and the power delivering stage 316. Due to the differential injection scheme, the boosting stage 318 includes a pair of boosters 318A and 318B. The boosters 318A and 318B are arranged to convert the pulse signals $V_{eg}$ and $V_{eg}'$ to boosted signals and $V_{ji}$ and $V_{jo}$ about 4-5 times of the first supply voltage ($V_{DD}$) to conduct the transistors M7-M10, respectively. An implementation of the booster 318A is depicted in FIG. 7 according to one embodiment of the present invention. Please note that such implementation is also suitable for the booster 318B. As depicted, the pulse signal $V_{eg}$ generated by the pulse generator 314A is used to trigger a latch circuit 350, preferably a RS-latch. Transition at outputs $V_o$ and $V_o'$ of the RS-latch 350 enables operation of the booster 318A. When the RS-latch output $V_o$ goes low and the RS-latch output $V_o'$ goes high, both signals $V_{sp}$ and $V_{sn}$ goes to low. Meanwhile, capacitors C3-C6 of a boosting circuit 370 which are previously parallel capacitor arrays (because of the high level of the signals $V_{sp}$ and $V_{sn}$) are converted into a series capacitors string (because of the low level of the signals $V_{sp}$ and $V_{sn}$). As a result, an output voltage that equals to about 4-5 times of the first supply voltage is generated. In addition, a partial-boosted voltage $V_{rs}$ is fed back to reset the RS-latch 350 for a next boosting operation. A delay circuit 360 is arranged to delay the RS-latch outputs $V_o$ and $V_o'$ with different delay amounts that guarantees that the NMOS transistors M21-M25 in the boosting circuit 370 must be cut-off prior to the conducting of PMOS transistors M31-M38 such that no shot through current occurs.

Based on the crystal oscillator, a method of generating an oscillation signal is provided, which comprises:

utilizing a crystal unit to oscillate for generating the oscillation signal; and intermittently injecting energy to the crystal unit.

In one embodiment, the step of intermittently injecting the energy to the crystal unit comprises:

slicing the oscillation signal to generate at least one sliced signal;

extracting at least one pulse signal from the least one sliced signal; and intermittently delivering the energy to the crystal unit according to the at least one pulse signal.

As principles and detailed operations of the present invention have been expressly illustrated by descriptions and drawings of the embodiments of the crystal oscillator as mentioned above, detailed descriptions regarding the method of the present invention are omitted here for the sake of the brevity.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In contrast with using the crystal unit as an inductive device in a feedback loop of the oscillation circuit (e.g. Pierce oscillator), the power injection technique provided by the present invention has fewer passive elements to contribute to power consumption (i.e., the load capacitors and feedback resistor of the Pierce oscillator consumes lot of power). Also, there is no amplifier operated in the linear region is required in the present invention. Therefore, the power consumption of the inventive crystal oscillator is greatly reduced. In addition, techniques used in the slicing stage and the boosting stage also effectively reduce power required by intermittently injecting the energy to the crystal unit. As a result, the present invention overcomes the difficult encountered by the related art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator, comprising:
   a crystal unit, arranged to oscillate to generate an oscillation signal; and
   a power injection module, coupled to the crystal unit, arranged to intermittently inject energy to the crystal unit, comprising:
      a slicing stage, coupled to the crystal unit, arranged to receive and slice at least the oscillation signal to generate at least one sliced signal;
      a pulse generating stage, coupled to the slicing stage, arranged to receive the at least one sliced signal and accordingly extract at least one pulse signal from the least one sliced signal; and
      a power delivering stage, coupled to the pulse generating stage, arranged to intermittently deliver the energy to the crystal unit according to the at least one pulse signal.

2. The crystal oscillator of claim 1, wherein the crystal unit has a first end; when a voltage level of the first end goes up, the power delivering stage provides a first supply voltage higher than the voltage level of the first end to the first end; and when the voltage level of the first end goes down, the power delivering stage provides a second supply voltage lower than the voltage level of the first end to the first end.

3. The crystal oscillator of claim 2, wherein the crystal unit further has a second end; the power delivering stage provides the second supply voltage to the second end of the crystal unit when providing the first supply voltage to the first end of the crystal unit; and the power delivering stage provides the first supply voltage to the second end of the crystal unit when providing the second supply voltage to the first end of the crystal unit.

4. The crystal oscillator of claim 1, wherein:
   the slicing stage comprises a pair of slicers including a first slicer and a second slicer, wherein the first slicer is coupled to a first end of the crystal unit and is arranged to receive the oscillation signal to generate a first sliced signal, the second slicer is coupled to a second end of the crystal unit and is arranged to receive an inversed signal of the oscillation signal to generate a second sliced signal which is an inversed signal of the first sliced signal; and
   the pulse generating stage comprises a pair of pulse generators including a first pulse generator and a second pulse generator, wherein the first pulse generator is coupled to the first slicer and arranged to receive the first sliced signal to generate a first pulse signal, and the second pulse generator is coupled to the second slicer and arranged to receive the second sliced signal to generate a second pulse signal which is an inversed signal of the first pulse signal.

5. The crystal oscillator of claim 1, wherein the slicing stage comprises:
   a coupling circuit, having a first output end and a second output end, arranged to receive the oscillation signal and respectively couple the oscillation signal to the first output end and the second output end;
   a slicing circuit, coupled to the coupling circuit, arranged to receive the oscillation signal coupled via the coupling circuit to generate the at least one sliced signal according to the oscillation signal; and
   a bias circuit, coupled to the slicing circuit and the coupling circuit, for biasing the slicing circuit.

6. The crystal oscillator of claim 5, wherein the slicing circuit comprises:
a first transistor, having a control end being coupled to the first output end of the coupling circuit to receive the oscillation signal and a first end being coupled to a first supply voltage;
a second transistor, having a control end being coupled to the second output end of the coupling circuit to receive the oscillation signal, a first end being coupled to the second end of the first transistor and a second end being coupled to a second supply voltage; and
an inverter, having an input end being coupled to the second end of the first transistor, arranged to generate the at least one sliced signal at an output end according to a signal provided by the second end of the first transistor.

7. The crystal oscillator of claim 6, wherein the bias circuit comprises:
a first diode-connected transistor, coupled between the coupling circuit and the first transistor, arranged to bias the first transistor; and
a second diode-connected transistor, coupled between the coupling circuit and the second transistor, arranged to bias the second transistor;
wherein the first transistor and the second transistor are biased at different direct current (DC) biasing points, respectively.

8. The crystal oscillator of claim 1, wherein the pulse generating stage comprises:
an inverter, coupled to the slicing stage, arranged to receive the at least one sliced signal and accordingly generate at least one inversed sliced signal; and
a NOR gate, coupled to the inverter and the slicing stage, arranged to receive the at least one sliced signal and the at least one inversed sliced signal to generate the at least one pulse signal.

9. The crystal oscillator of claim 1, wherein the power injection module further comprises:
a boosting stage, coupled between the pulse generating stage and the power delivering stage, arranged to boost the at least one pulse signal to generate at least one boosted signal, wherein the power delivering stage intermittently delivers the energy to the crystal unit according to the at least one boosted signal.

10. The crystal oscillator of claim 9, wherein the boosting stage comprises a pair of boosters including a first booster and a second booster, the first booster is coupled to the pulse generating stage and is arranged to receive a pulse signal of the at least one pulse signal to generate a first boosted signal, and the second booster of the boosters is coupled to the pulse generating stage and arranged to receive an inversed pulse signal of the at least one pulse signal to generate a second boosted signal which is an inversed signal of the first boosted signal.

11. The crystal oscillator of claim 9, wherein the boosting stage comprises:
a latch circuit, coupled to the pulse generating stage, arranged to generate a latched signal and an inversed latched signal according to the at least one pulse signal and a partially-boosted signal; and
a boosting circuit, having a plurality of capacitors, arranged to generate the at least one boosted signal according to the latched signal and the inversed latched signal, wherein the partially-boosted signal is generated at a node between the plurality of capacitors.

12. The crystal oscillator of claim 11, wherein the capacitors of the boosting circuit are transformed from a plurality of parallel capacitor arrays into a serial capacitor string when the latched signal has a level transition, thereby generating the least one boosted signal.

13. The crystal oscillator of claim 1, further comprising:
an oscillation start-up circuit, coupled to the crystal unit, arranged to trigger the crystal unit to start oscillating, wherein the oscillation start-up circuit is turned off when the power injection module intermittently injects the energy to the crystal unit.

14. A method of generating an oscillation signal, comprising:
utilizing a crystal unit to oscillate for generating the oscillation signal; and
intermittently injecting energy to the crystal unit, comprising:
slicing the oscillation signal to generate at least one sliced signal;
extracting at least one pulse signal from the least one sliced signal; and
intermittently delivering the energy to the crystal unit according to the at least one pulse signal.

15. The method of claim 14, wherein the crystal unit has a first end and the step of intermittently injecting the energy to the crystal unit comprises:
when a voltage level of the first end goes up, providing a first supply voltage higher than the voltage level of the first end to the first end; and
when the voltage level of the first end goes down, providing a second supply voltage lower than the voltage level of the first end to the first end.

16. The method of claim 15, wherein the crystal unit further has a second end and the step of intermittently injecting the energy to the crystal unit comprises:
providing the second supply voltage to the second end of the crystal unit when providing the first supply voltage to the first end of the crystal unit; and
providing the first supply voltage to the second end of the crystal unit when providing the second supply voltage to the first end of the crystal unit.

17. The method of claim 14, wherein the step of extracting the at least one pulse signal from the least one sliced signal comprises:
receiving the at least one sliced signal and accordingly generating at least one inversed sliced signal; and
performing a NOR operation upon the at least one sliced signal and the at least one inversed sliced signal to generate the at least one pulse signal.

18. The method of claim 14, further comprising:
boosting the at least one pulse signal to generate at least one boosted signal; and
intermittently delivering the energy to the crystal unit according to the at least one boosted signal.

19. The method of claim 18, wherein the step of boosting the at least one pulse signal to generate at least one boosted signal comprises:
generating a latched signal and an inversed latched signal by a latch circuit according to the at least one pulse signal and a partially-boosted signal; and
utilizing a boosting circuit having a plurality of capacitors to generate the at least one boosted signal according to the latched signal and the inversed latched signal, wherein the partially-boosted signal is generated at a node between the plurality of capacitors.

20. The method of claim 19, wherein the step of utilizing the boosting circuit having the plurality of capacitors to generate the at least one boosted signal comprises:

transforming a plurality of parallel capacitor arrays of capacitors into a serial capacitor string when the latched signal has a level transition, thereby generating the least one boosted signal.

21. The method of claim 14, further comprising:

utilizing an oscillation start-up circuit to trigger the crystal unit to start oscillating; and turning off the oscillation start-up circuit when intermittently injecting the energy to the crystal unit.

* * * * *